(12) United States Patent
Nishinohara et al.

(10) Patent No.: US 9,831,450 B2
(45) Date of Patent: Nov. 28, 2017

(54) DISPLAY DEVICE

(71) Applicant: Japan Display Inc., Tokyo (JP)

(72) Inventors: Takuma Nishinohara, Tokyo (JP); Yasukazu Kimura, Tokyo (JP); Jun Fujiyoshi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/175,251

(22) Filed: Jun. 7, 2016

(65) Prior Publication Data

US 2016/0365523 A1    Dec. 15, 2016

(30) Foreign Application Priority Data

Jun. 12, 2015 (JP) ................................ 2015-119249

(51) Int. Cl.
| | | |
|---|---|---|
| *H01L 51/00* | (2006.01) | |
| *H01L 27/12* | (2006.01) | |
| *H01L 27/32* | (2006.01) | |
| *H01L 51/52* | (2006.01) | |

(52) U.S. Cl.
CPC ...... *H01L 51/0097* (2013.01); *H01L 27/1218* (2013.01); *H01L 27/3248* (2013.01); *H01L 27/3262* (2013.01); *H01L 51/5237* (2013.01); *H01L 51/529* (2013.01); *Y02E 10/549* (2013.01)

(58) Field of Classification Search
None
See application file for complete search history.

(56) References Cited

U.S. PATENT DOCUMENTS

| | | | | |
|---|---|---|---|---|
| 9,219,252 | B2* | 12/2015 | Nishimura | H01L 51/5275 |
| 2003/0213956 | A1* | 11/2003 | Hioki | G02F 1/133305 |
| | | | | 257/59 |
| 2004/0229051 | A1* | 11/2004 | Schaepkens | C23C 14/022 |
| | | | | 428/447 |
| 2005/0214556 | A1* | 9/2005 | Nishimi | C08K 3/0008 |
| | | | | 428/500 |
| 2010/0151274 | A1* | 6/2010 | Kang | B05D 3/065 |
| | | | | 428/688 |
| 2011/0140164 | A1* | 6/2011 | Seo | H01L 51/5256 |
| | | | | 257/100 |
| 2012/0187435 | A1* | 7/2012 | Gy | C03C 17/3411 |
| | | | | 257/98 |
| 2012/0286258 | A1* | 11/2012 | Naraoka | C09K 11/06 |
| | | | | 257/40 |

(Continued)

FOREIGN PATENT DOCUMENTS

| | | |
|---|---|---|
| JP | 2000-019311 A | 1/2000 |
| JP | 2015-079861 A | 4/2015 |

*Primary Examiner* — Lex Malsawma
(74) *Attorney, Agent, or Firm* — Typha IP LLC

(57) ABSTRACT

A display device includes a first organic layer, a first inorganic layer, a second organic layer, a second inorganic layer, and a thin film transistor. The first organic layer has a roughened top surface. The first inorganic layer has a roughened top surface and is disposed to have a roughened bottom surface that is in contact with the roughened top surface of the first organic layer. The second organic layer has a roughened bottom surface that is in contact with the roughened top surface of the first inorganic layer. The second inorganic layer is disposed to be in contact with the top surface of the second organic layer. The thin film transistor is disposed on the top surface of the second inorganic layer.

15 Claims, 4 Drawing Sheets

(56) References Cited

U.S. PATENT DOCUMENTS

| | | | |
|---|---|---|---|
| 2013/0236713 A1* | 9/2013 | Park | H01L 31/03923 428/216 |
| 2014/0042426 A1* | 2/2014 | Nishimura | H01L 51/5275 257/40 |
| 2014/0167006 A1* | 6/2014 | Kim | H01L 27/3244 257/40 |
| 2014/0231776 A1* | 8/2014 | Takahashi | B29C 59/022 257/40 |
| 2014/0306213 A1* | 10/2014 | Sato | H01L 51/5275 257/40 |
| 2015/0108488 A1 | 4/2015 | Hiramatsu et al. | |

* cited by examiner

DISPLAY DEVICE

CROSS-REFERENCE TO RELATED APPLICATION

The present application claims priority from Japanese application JP2015-119249 filed on Jun. 12, 2015, the content of which is hereby incorporated by reference into this application.

BACKGROUND OF THE INVENTION

1. Field of the Invention

The present invention relates to a display device.

2. Description of the Related Art

A display device having an under insulating layer (underlayer) is conventionally known (e.g., FIG. 2 of JP 2015-079861 A). The underlayer functions as a barrier layer that prevents moisture from entering a self-luminous element layer including a light-emitting layer. In some cases, the underlayer is formed by stacking an inorganic layer and an organic layer.

SUMMARY OF THE INVENTION

It is an object of the present invention to prevent stacked organic and inorganic layers in a display device from separating from each other.

An aspect of the present invention includes a first organic layer, a first inorganic layer, a second organic layer, a second inorganic layer, and a thin film transistor. The first organic layer has a roughened top surface. The first inorganic layer has a roughened bottom surface that is in contact with the roughened top surface of the first organic layer and a roughened top surface following the bottom surface. The second organic layer has a roughened bottom surface that is in contact with the roughened top surface of the first inorganic layer. The second inorganic layer is in contact with the top surface of the second organic layer. The thin film transistor is disposed above the second inorganic layer.

DETAILED DESCRIPTION OF THE INVENTION

The following describes embodiments of the present invention with reference to the accompanying drawings.

Figure 1:
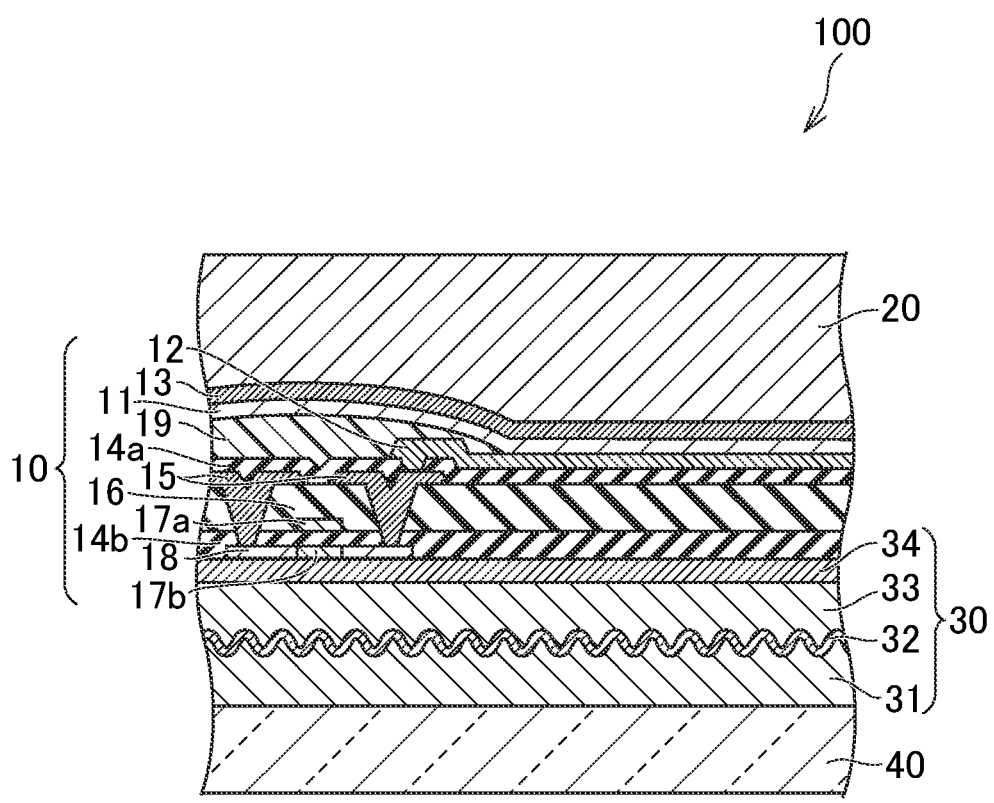
FIG. 1 is a diagram schematically showing a general structure of a display device according to this embodiment.

FIG. 1 is a diagram schematically showing a general structure of a display device according to this embodiment. An organic EL (electroluminescent) display device (hereinafter, simply "display device") 100 according to this embodiment is a display device that displays images on a display unit in which a plurality of pixels are formed. As shown in FIG. 1, the display device 100 includes a self-luminous element layer 10, a sealing layer 20, an underlayer 30, and a protective layer 40 (also referred to as a protective film), which is formed by stacking them. The display device shown in FIG. 1 is a flexible display device (flexible display) in which a flexible resin substrate (film substrate) made of, for example, a polyimide resin is used instead of a glass substrate. The underlayer 30 shown in FIG. 1 includes this resin substrate.

A stack structure of the self-luminous element layer 10 is now described with reference to FIG. 1. The self-luminous element layer 10 only needs to be a layer in which the brightness of emitted light is controlled by each of a plurality of unit pixels that form images, and is not limited to the structure shown in FIG. 1.

The self-luminous element layer 10 includes a self-luminous light-emitting layer 11, a lower electrode 12 disposed on the bottom surface of the light-emitting layer 11, and an upper electrode 13 disposed on the top surface of light-emitting layer 11. In FIG. 1, the self-luminous element layer 10 also includes a thin film transistor coupled to the lower electrode 12. That is, the self-luminous element layer 10 includes insulating layers 14a and 14b, a source-drain electrode 15, an insulating layer 16, a gate line layer 17a, a polysilicon layer 17b, a source-drain region 18, and a bank 19 that are included in the thin film transistor.

The lower electrode 12 is formed to cover a portion to be a light-emitting area and is coupled to the source-drain electrode 15 through a through-hole in the insulating layer 14a. The bank 19 is formed on the edge portion of the lower electrode 12 and over a non-light-emitting area including the polysilicon layer 17b and the gate line layer 17a. The light-emitting layer 11 is formed to cover the lower electrode 12, but is separated from the lower electrode 12 by the bank 19 in the non-light-emitting area.

One of the lower electrode 12 and the upper electrode 13 functions as an anode, and the other functions as a cathode. When a DC voltage is applied across the lower electrode 12 and the upper electrode 13, holes injected from the anode reach the light-emitting layer 11 via a hole transport layer (not shown), electrons injected from the cathode reach the light-emitting layer 11 via an electron transport layer (not shown), and then the holes and the electrons recombine there. The recombination of electrons and holes causes the light-emitting layer 11 to emit light of a certain wavelength.

The sealing layer 20 seals the self-luminous element layer 10 to prevent, for example, moisture from entering the self-luminous element layer 10. The sealing layer 20 may be formed of a dense inorganic layer such as silicon nitride or a film stack including an inorganic layer and an organic layer. The sealing layer 20 may include a color filter that absorbs light of a specific wavelength and that passes light of other wavelengths through itself. The underlayer 30 is disposed on the bottom surface of the self-luminous element layer 10. The protective layer 40 is made of an organic material, such as a polyimide resin or a polyethylene terephthalate resin, and is disposed on the bottom surface of the underlayer 30. The protective layer 40 may be absent.

Figure 2:
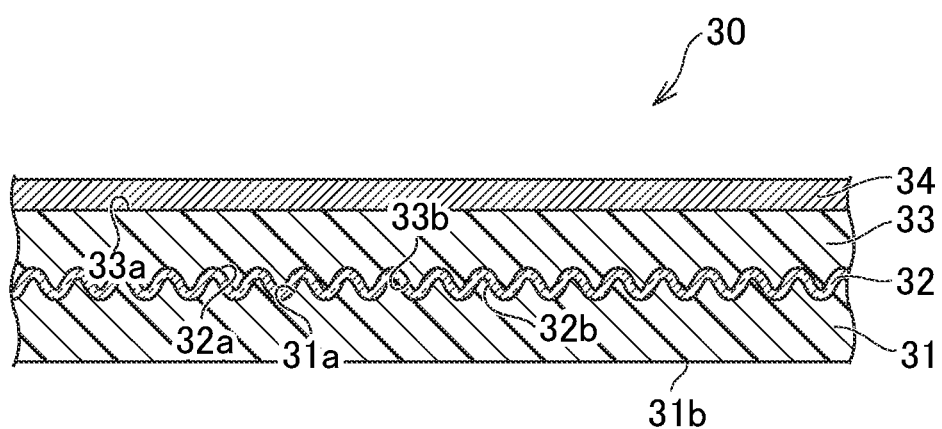
FIG. 2 is a cross-sectional view of an underlayer, which schematically shows details of a stack structure of the underlayer.

The following describes details of a stack structure of the underlayer 30. FIG. 2 is a cross-sectional view of the underlayer 30, which schematically shows details of the stack structure of the underlayer 30. The underlayer 30 has a structure in which at least two organic layers (e.g., resin layers) and at least two inorganic layers are alternately stacked on top of each other. Use of the underlayer having such a stack structure provides improved barrier properties compared with use of an underlayer having a single structure including one organic layer and one inorganic layer that are stacked, and prevents moisture from entering the self-luminous element layer 10.

The underlayer 30 includes a first organic layer 31 (first resin layer), a first inorganic layer 32, a second organic layer 33, and a second inorganic layer 34. As a material of the first organic layer 31 and the second organic layer 33, a polyimide resin or a polyethylene terephthalate resin may be used. As a material of the first inorganic layer 32 and the second inorganic layer 34, for example, silicon oxide or silicon nitride is used. Alternatively, a moisture-resistant metal, such as titanium, may be used as a material of the first inorganic layer 32 and the second inorganic layer 34. It can be considered that the first organic layer 31 corresponds to a resin substrate used in the flexible display instead of a glass substrate. Alternatively, it can be considered that the first organic layer 31, the first inorganic layer 32, and the second organic layer 33 are a substrate (also referred to as a base material) of the flexible display with a plurality of organic layers, and that the second inorganic layer 34 is an under film disposed between the substrate and the thin film transistor.

The first organic layer 31 has a roughened top surface 31a with projections and depressions. It is preferable that the roughened top surface 31a of the first organic layer 31 has a maximum height roughness greater than or equal to 10 nm and less than or equal to 100 nm, and also has an arithmetic mean roughness greater than or equal to 1 nm and less than or equal to 5 nm. The maximum height roughness is the height from a reference level in the thickness direction of the layer to the top of the projections of the layer, and the arithmetic mean roughness is the mean value of the heights of the projections from the reference level.

The first inorganic layer 32 has a roughened bottom surface 32b and a roughened top surface 32a. The bottom surface 32b is in contact with the roughened top surface 31a of the first organic layer 31. The roughened top surface 32a follows the bottom surface 32b.

The second organic layer 33 has a bottom surface 33b roughened by its close contact with the roughened top surface 32a of the first inorganic layer 32. The second inorganic layer 34 is formed in close contact with the top surface 33a of the second organic layer 33. Above the second inorganic layer 34, various interconnections and a driver circuit including thin film transistors are formed in addition to the self-luminous element layer 10 shown in FIG. 1. As shown in FIGS. 1 and 2, for the second organic layer 33, which is in contact with the second inorganic layer 34, the bottom surface (second surface) 33b is rougher than the top surface (first surface) 33a.

The underlayer 30 shown in FIGS. 1 and 2 has a structure including two organic layers and two inorganic layers that are alternately stacked on top of each other, but is not limited to this structure. The underlayer 30 only needs to have a structure including at least two organic layers and at least two inorganic layers that are alternately stacked on top of each other. Thus, three or more organic layers and three or more inorganic layers may be alternately stacked on top of each other.

The following describes a process for manufacturing the display device 100 according to this embodiment with reference to FIGS. 3A to 3D. FIGS. 3A to 3D are process diagrams for illustrating a process for manufacturing the display device 100 according to this embodiment.

Figure 3A:
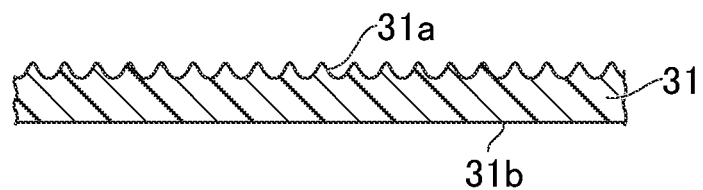
FIG. 3A is a process diagram for illustrating a process for manufacturing the display device according to this embodiment.

As shown in FIG. 3A, the roughened top surface 31a is first formed by applying a plasma treatment to the top surface of the first organic layer 31 so that the top surface has projections and depressions. As the plasma treatment, for example, a nitrogen plasma treatment or an oxygen plasma treatment may be applied. The formation of the roughened top surface 31a is not limited to plasma treatment. For example, nanoimprint technology may be used for forming the roughened top surface 31a. The first organic layer 31 is formed on a support substrate (not shown), for example, made up of a glass substrate. Then, after the self-luminous element layer 10 and other components shown in FIG. 1 are formed, the support substrate is separated from the first organic layer 31 by a known method. The first organic layer 31 may be formed by applying liquid varnish on a glass plate or by using a solid film made of an organic material.

Figure 3B:
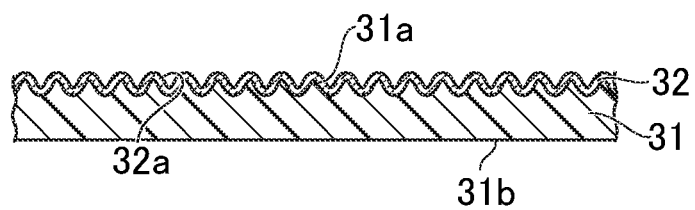
FIG. 3B is a process diagram for illustrating the process for manufacturing the display device according to this embodiment.

Subsequently, the first inorganic layer 32 is formed on the roughened top surface 31a of the first organic layer 31. As shown in FIG. 3B, the top surface of the first inorganic layer 32 has projections and depressions following the shape of the roughened top surface 31a.

Figure 3C:
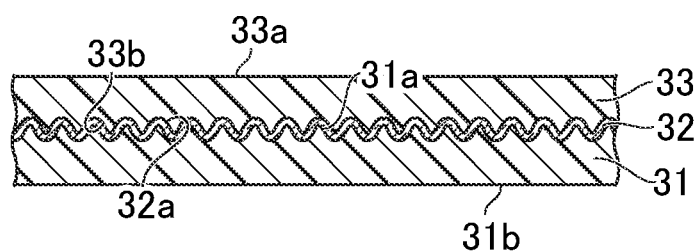
FIG. 3C is a process diagram for illustrating the process for manufacturing the display device according to this embodiment.

Next, as shown in FIG. 3C, the second organic layer 33 is formed on the roughened top surface 32a of the first inorganic layer 32. The bottom surface 33b of the second organic layer 33 is roughened by close contact of the second organic layer 33 with the roughened top surface 32a of first inorganic layer 32. On the other hand, the top surface 33a of the second organic layer 33 is formed substantially flat by applying a varnish made of an organic material.

Figure 3D:
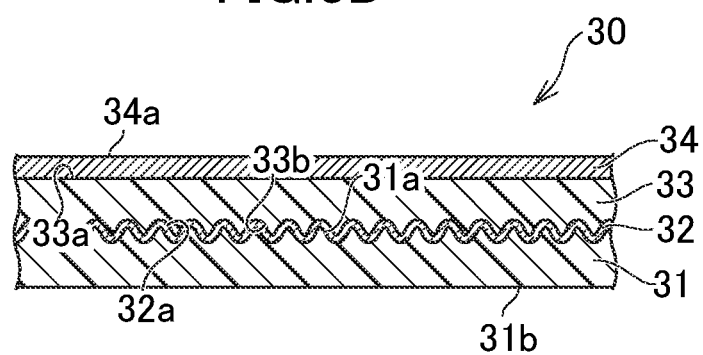
FIG. 3D is a process diagram for illustrating the process for manufacturing the display device according to this embodiment.

As shown in FIG. 3D, the second inorganic layer 34 is then formed on the top surface 33a of the second organic layer 33. The top surface 33a of the second organic layer 33 is substantially flat, and thus the top surface 34a of the second inorganic layer 34 formed on the second organic layer 33 becomes substantially flat. The top surface 34a of the second inorganic layer 34, which is substantially flat, does not affect its close contact with the self-luminous element layer 10 having a substantially flat bottom surface, and thus allows the self-luminous element layer 10 to be formed on its planarized surface.

After a plasma treatment is applied to the top surface 33a of the second organic layer 33, the second inorganic layer 34 may be stacked on the second organic layer 33. On close examination, the inventors have found that applying a plasma treatment to the top surface 33a of the second organic layer 33 so as not to roughen the top surface 33a promotes adhesion between the second organic layer 33 and the second inorganic layer 34. The top surface 33a of the second organic layer 33 is not roughened, and thus the bottom surface 34b and the top surface 34a of the second inorganic layer 34 are also not roughened.

After that, the self-luminous element layer 10 and the sealing layer 20 are stacked on the second inorganic layer 34. The protective layer 40 is then stacked on the bottom surface 31b of the first organic layer 31. Thereby, the display device 100 shown in FIG. 1 is completed. When the first organic layer 31 is formed on the support substrate, the support substrate is separated, and the protective layer 40 is then laminated to the bottom surface 31b of the first organic layer 31. The protective layer 40 is the outermost layer of the display device 100 according to this embodiment.

Figure 4:
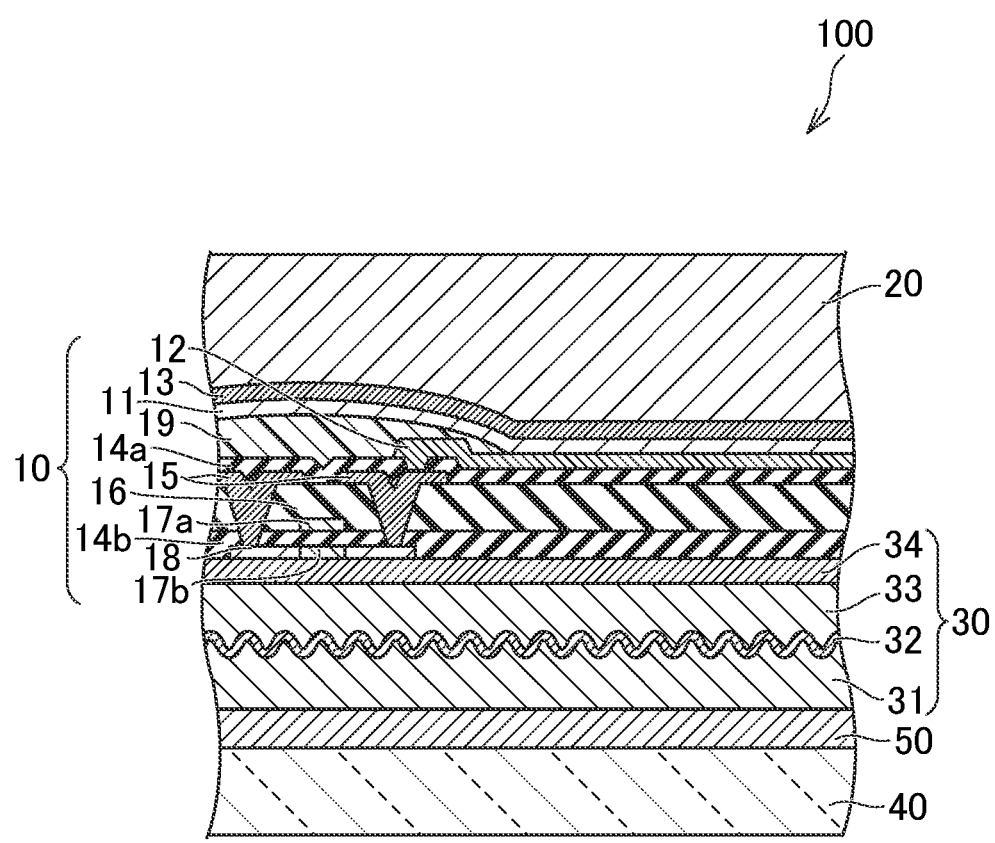
FIG. 4 is a diagram schematically showing a general structure of a display device according to a modification of this embodiment.

As shown in FIG. 4, a thermal diffusion layer 50 may be provided between the first organic layer 31 and the protective layer 40. The thermal diffusion layer 50 thus provided allows temperature distribution to disperse, thereby preventing part of the display device from generating an excessive heat. The protective layer 40 and the thermal diffusion layer 50 shown in FIGS. 2 and 4 are not essential to the present invention. The first organic layer 31 may be the outermost layer of the display device 100.

An underlayer having a structure in which two organic layers and two inorganic layers are alternately stacked on top of each other increases the risk of layer separation because the interface of the organic layers and the inorganic layers increases. However, in this embodiment, a structure in which the first organic layer 31 and the first inorganic layer 32 are in close contact with each other on their roughened surfaces and in which the first inorganic layer 32 and the second organic layer 33 are in close contact with each other on their roughened surfaces improves adhesion at the interface between each pair of layers, thus making layer separation less likely to occur. In addition, a plasma treatment is applied to the top surface 33a of the second organic layer 33, and the second inorganic layer 34 is then brought into close contact with the top surface 33a. Consequently, improved adhesion at the interface between the second organic layer 33 and the second inorganic layer 34 is provided, thus making layer separation less likely to occur.

The first organic layer 31, the first inorganic layer 32, and the second organic layer 33 each have projections and depressions on its one or both surfaces. Accordingly, internal stresses in these layers are reduced. In particular, applying the structure according to this embodiment to a flexible display device, which allows an image display unit to be flexibly curved, produces the effects of improving the flexural strength of each layer and of making the layers less likely to separate from each other.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a first organic layer having a roughened top surface;
a first inorganic layer having a roughened bottom surface and a roughened top surface following the roughened bottom surface, the roughened bottom surface being in contact with the roughened top surface of the first organic layer;
a second organic layer having a roughened bottom surface in contact with the roughened top surface of the first inorganic layer;
a second inorganic layer in contact with a top surface of the second organic layer; and
a thin film transistor above the second inorganic layer, wherein the first organic layer has a bottom surface opposite to the roughened top surface thereof,
a thermal diffusion sheet is disposed on the bottom surface of the first organic layer, and
a protective layer formed of a resin is disposed on an opposite surface of the thermal diffusion sheet from the bottom surface of the first organic layer.

2. The display device according to claim 1, further comprising, above the second inorganic layer:
a lower electrode coupled to the thin film transistor;
a light-emitting layer on the lower electrode; and
an upper electrode on the light-emitting layer.

3. The display device according to claim 1, wherein the roughened top surface of the first organic layer has a maximum height roughness greater than or equal to 10 nm and less than or equal to 100 nm.

4. The display device according to claim 1, wherein the roughened top surface of the first organic layer has an arithmetic mean roughness greater than or equal to 1 nm and less than or equal to 5 nm.

5. The display device according to claim 1, wherein a plasma treatment is applied to the top surface of the second organic layer.

6. The display device according to claim 1, wherein the second organic layer is formed by applying a varnish made of an organic material to the roughened top surface of the first inorganic layer.

7. A display device comprising:
a substrate;
an under film on the substrate, the under film being made of an inorganic material; and
a thin film transistor on the under film, wherein the substrate has a stack structure including a plurality of resin layers sandwiching an inorganic layer therebetween,
a resin layer in contact with the under film, among the plurality of resin layers, has a first surface located at a side of the under film and a second surface opposite to the first surface, and
the second surface is rougher than the first surface.

8. The display device according to claim 7, wherein an outermost layer which is located at an opposite side of the substrate from the thin film transistor is one of the plurality of resin layers.

9. The display device according to claim 8, wherein a protective film formed of a resin is disposed on an opposite surface of the outermost layer from the under film.

10. The display device according to claim 7, wherein the substrate includes a first inorganic layer in contact with the second surface and a first resin layer in contact with an opposite surface of the first inorganic layer from the second surface, and
a surface of the first resin layer is rougher than the first surface, the surface being in contact with the first inorganic layer.

11. The display device according to claim 7, wherein the substrate is flexible.

12. A display device comprising:
a first organic layer having a first roughened top surface;
a first inorganic layer having a first roughened bottom surface and a second roughened top surface, the first roughened bottom surface being in contact with the first roughened top surface of the first organic layer;
a second organic layer having a bottom surface in contact with the second roughened top surface of the first inorganic layer, and a top surface opposite to the bottom surface;
a second inorganic layer in contact with the top surface of the second organic layer; and
a thin film transistor above the second inorganic layer, wherein the bottom surface of the second organic layer is rougher than the top surface of the second organic layer.

13. The display device according to claim 12, wherein the second inorganic layer has a surface located at an opposite side of the second organic layer, and
the surface is rougher than the top surface of the second organic layer.

14. The display device according to claim 12, wherein the second inorganic layer has a surface located at an opposite side of the second organic layer, and the surface is substantially flat.

15. The display device according to claim 12, wherein the top surface of the second organic layer is substantially flat.

* * * * *